(12) United States Patent
Gamliel

(10) Patent No.: US 7,760,485 B1
(45) Date of Patent: Jul. 20, 2010

(54) LOW LOSS AND HIGH FREQUENCY LUMPED CAPACITOR

(75) Inventor: Doron Gamliel, Kiriat-Ata (IL)

(73) Assignee: Scientific Components Corporation, Brooklyn, NY (US)

( * ) Notice: Subject to any disclaimer, the term of this patent is extended or adjusted under 35 U.S.C. 154(b) by 578 days.

(21) Appl. No.: 11/595,671

(22) Filed: Nov. 9, 2006

(51) Int. Cl.
 *H01G 4/005* (2006.01)
 *H01G 4/06* (2006.01)
(52) U.S. Cl. ...................... 361/303; 361/311
(58) Field of Classification Search ......... 361/303–305, 361/311
See application file for complete search history.

(56) References Cited

U.S. PATENT DOCUMENTS

| | | | |
|---|---|---|---|
| 5,144,526 A | 9/1992 | Vu et al. | |
| 6,816,032 B1 | 11/2004 | Gaynor et al. | |
| 6,940,710 B1* | 9/2005 | Lee et al. | 361/321.2 |
| 7,050,289 B2* | 5/2006 | Togashi | 361/306.3 |
| 7,054,134 B2 | 5/2006 | Togashi et al. | |
| 2003/0198006 A1* | 10/2003 | Kuroda et al. | 361/306.1 |
| 2005/0190529 A1* | 9/2005 | Togashi | 361/306.1 |
| 2006/0018081 A1* | 1/2006 | Hwa Lee et al. | 361/321.2 |
| 2006/0028785 A1* | 2/2006 | Togashi et al. | 361/321.2 |
| 2007/0103846 A1* | 5/2007 | Eggerding et al. | 361/306.3 |

* cited by examiner

*Primary Examiner*—Eric Thomas
(74) *Attorney, Agent, or Firm*—Siegmar Silber

(57) ABSTRACT

There is disclosed a low loss and high frequency lumped capacitor that is ideally constructed from LTCC dielectric material and deposited conductive layers. The capacitive plates are shaped as identical and overlapping serpentine conductive paths positioned on either side of a thin dielectric layer, with opposite ends of the conductive paths used for signal contact points. The net effect of the shape of the capacitive plates and the resulting approximately equal and opposite current flows is to cancel the majority of parasitic inductance at high frequencies, thus reducing insertion loss. Filters built using this construction of capacitor exhibit improved high frequency performance. This type of capacitor also has a simplicity of construction that allows integration into LTCC fabricated circuitry without requiring extra layers or terminals.

22 Claims, 10 Drawing Sheets

LOW LOSS AND HIGH FREQUENCY LUMPED CAPACITOR

CROSS REFERENCE TO RELATED APPLICATIONS

N/A

STATEMENT REGARDING FEDERALLY SPONSORED RESEARCH OR DEVELOPMENT

N/A

TECHNICAL FIELD

The present invention relates generally to high frequency capacitors, and more specifically to low loss and high frequency lumped capacitors formed with LTCC (low temperature co-fired ceramic) material as the dielectric.

BACKGROUND

A lumped element circuit device is one that can be described by a simple linear equation during operation at high frequencies, generally 1 GHz or higher. Lumped element circuit devices are used at high frequencies in circuits such as high-pass filters, including frequencies in the microwave region where electronic circuit elements designed for adequate performance at lower frequencies may exhibit severely degraded operating characteristics. In general, to be considered a lumped element electronic component, the component must be dimensioned much smaller than a quarter wavelength of the intended maximum operating frequency, and in fact no feature of the component's structure should exceed 1/10 of a wavelength at the maximum operating frequency.

One common method for fabricating sufficiently miniaturized high-frequency capacitors and related circuits is with the use of LTCC materials as the body and dielectric of the capacitor, and metal conductive layers applied with screen printing or other deposition techniques. The details of these fabrication techniques are well known in the art, and an example of this type of capacitor can be seen in U.S. Pat. No. 5,144,526 entitled LOW TEMPERATURE CO-FIRED CERAMIC STRUCTURE CONTAINING BURIED CAPACITORS.

An example of an LTCC-implemented high-frequency filter can be seen in U.S. Pat. No. 6,816,032 entitled LAMINATED LOW-PROFILE DUAL FILTER MODULE FOR TELECOMMUNICATIONS DEVICES AND METHOD THEREFOR. The capacitors implemented in this module are very simple, with one plate of each capacitor formed by an associated ground plane.

As operating frequencies increase, so does the effect of the equivalent series inductance (ESL) of the capacitor. The voltage change $\Delta V$ can be expressed as $$\Delta V = ESL * di/dt$$

where di/dt expresses the change in current with time. Thus, as the di/dt increases as frequency increases, the effect of the ESL becomes more of a problem to device function. The ESL, also called parasitic inductance, causes the capacitor to deviate from theoretical ideal operating conditions and results in an insertion loss when the capacitor is used in a high frequency circuit. Such insertion losses can seriously compromise circuit performance.

Some LTCC capacitors have been designed to mitigate the parasitic inductance present at high frequencies. A typical approach to solving the parasitic inductance problem is taught in U.S. Pat. No. 7,054,134 entitled STACKED CAPACITOR. Multiple internally deposited conductors are stacked alternately between dielectric layers and attached to multiple extraction electrodes which serve as terminals. The geometry of partially overlapping extraction electrodes of opposite polarities serves to generate oppositely flowing currents between any two conductors, which separated by thin dielectric layers, serves to cancel out a portion of the magnetic flux generated by the current in each conductor, thus reducing the capacitor's ESL.

A drawback to the structure taught by the '134 patent is the need to fabricate a very complex multilayered structure, where the addition of each dielectric layer, internal conductor and extraction electrode contributes increased cost and the chance for fabrication errors causing decreased performance and rejected components. A further drawback is the need to make electrical contact to the multiplicity of electrodes when the capacitor is assembled into the final circuit, where each additional solder connection also represents an additional chance for failure and an additional possible limitation on frequency response. In general, the fewer external connections that are needed between elements in a high frequency circuit, the higher the frequencies that the circuit can respond to without unacceptable losses. Additionally, the complexity of the structure taught by the '134 patent raises significant barriers to economical incorporation of this type of capacitor into an LTCC-implemented circuit such as a filter.

A significant improvement over the existing art would be a lumped capacitor that could be economically and reliably fabricated for use in high-frequency circuits such as filters designed to be produced with standard LTCC fabrication techniques, using a minimum number of dielectric layers, conductors and terminals, having a minimum of parasitic inductance and thus yielding a broad frequency performance and low insertion loss close to the theoretical ideal.

SUMMARY

In accordance with the present invention, a low loss and high frequency lumped capacitor capable of being fabricated as a portion of a high-frequency filter circuit is disclosed that uses conductors formed as overlapping aligned serpentine path geometries enclosed within and separated by a thin layer of dielectric material to achieve low parasitic inductance and thus near-ideal high frequency performance.

The preferred dielectric material is generally of LTCC type, manufactured in a green or unfired state, in the form of a long ribbon or tape that is cut to length to form rectangular segments, also referred to hereinafter as dielectric layers. Some dielectric layers may be composed of multiple thicknesses of the basic ribbon or tape. Conductive material is silkscreened or otherwise deposited in a controlled pattern upon the tape. By stacking a group of dielectric layers with and without conductive deposits and with metalized vias for conduction between dielectric layers where necessary, a variety of circuit functions can be realized.

Serpentine pathways formed of conductive material are generally used to achieve a long conductive path length in a small area. The serpentine pathway geometry uses a very high length to width ratio, with the path generally folded back upon itself at least once but multiple times if necessary. Each place where the path folds back upon itself is generally formed by a pair of closely spaced bend regions of approximately 90° each, thus including a total of approximately 180° of bend. These bends may include chamfered or rounded internal or external corners. In some cases, optimal space utilization may be realized by including one or more jogged paths or single 90° bends. In all cases, the path width may or may not remain equal through the bend region and along the conductive path. The geometry of the path must result in having sufficient conductor area to achieve the necessary capacitance. An insulating gap is present between parallel or otherwise adjacent sections of the conductive path to prevent electrical shorting and high-frequency interference. Electrical contact is generally made at the path ends.

The two conductors that form the plates of the capacitor are situated on either side of a thin sheet of dielectric material, with additional generally thicker sheets of dielectric material enclosing the conductors and optionally a deposit of a ground conductor covering at least a portion of the dielectric surface serving as the bottom of the assembled capacitor. The conductors may be formed by a variety of methods, including but not limited to silkscreening a film containing metal particles on a green (unfired) ceramic layer. When the assembled green structure is fired, the metal particles in the film fuse to form a conductive path.

The two conductors are ideally formed into identical serpentine conductive pathways, and if viewed orthogonally to the planes of the dielectric layers through the stack of laminated layers (a direction referred to hereinafter as the axis of lamination) the two serpentine conductive pathways are seen to overlap and align with high precision. The overall stack of laminated LTCC layers is referred to hereinafter as the dielectric body.

The minimization of inherent parasitic inductance in the lumped capacitor is accomplished by applying a time-varying input voltage signal across a pair of opposite ends of the conductive pathways, thereby causing equal but opposite currents flow in the two pathways. With the two conductive pathways spaced closely together by the thin intermediate dielectric layer, there is an electromagnetic response equivalent to coupled inductors with equal but opposite currents, resulting in a net cancellation of inductance.

Another aspect of the invention is that by controlling the shape and size of the conductive pathways, a variety of capacitive values with near-ideal high frequency response may be achieved with great precision.

Yet another aspect of the invention is that the low loss and high frequency lumped capacitor has a simple enough structure to not increase layer count, via count or other elements of manufacturing cost and complexity when incorporated into high frequency circuits including filter circuits built from layers of LTCC dielectric and deposited conductors.

These various embodiments of the invention offer significant improvement to the high frequency performance and economical manufacturing of a lumped capacitor, and in particular to high frequency filter circuits incorporating such lumped capacitors. The general circuit analysis and operation methodologies and high frequency capacitors and filter circuitry disclosed hereinafter are well known to those skilled in the art.

OBJECTS AND FEATURES OF THE INVENTION

It is an object of the present invention to provide a lumped capacitor capable of low insertion loss performance at multi-gigahertz frequencies.

It is another object of the present invention to provide this low insertion loss performance for a range of capacitance values.

It is yet another object of the present invention to directly incorporate this lumped capacitor into high-frequency filter circuits.

It is a further object of the present invention to directly incorporate this lumped capacitor into high-frequency filter circuits fabricated with LTCC dielectric materials.

Other features, functions and aspects of the invention will become evident from the Detailed Description that follows.

BRIEF DESCRIPTION OF THE SEVERAL VIEWS OF THE DRAWINGS

The present version of the invention will be more fully understood with reference to the following Detailed Description in conjunction with the drawings of which.

DESCRIPTION OF THE PREFERRED EMBODIMENT AND BEST MODE

Prior Art

Figure 1:
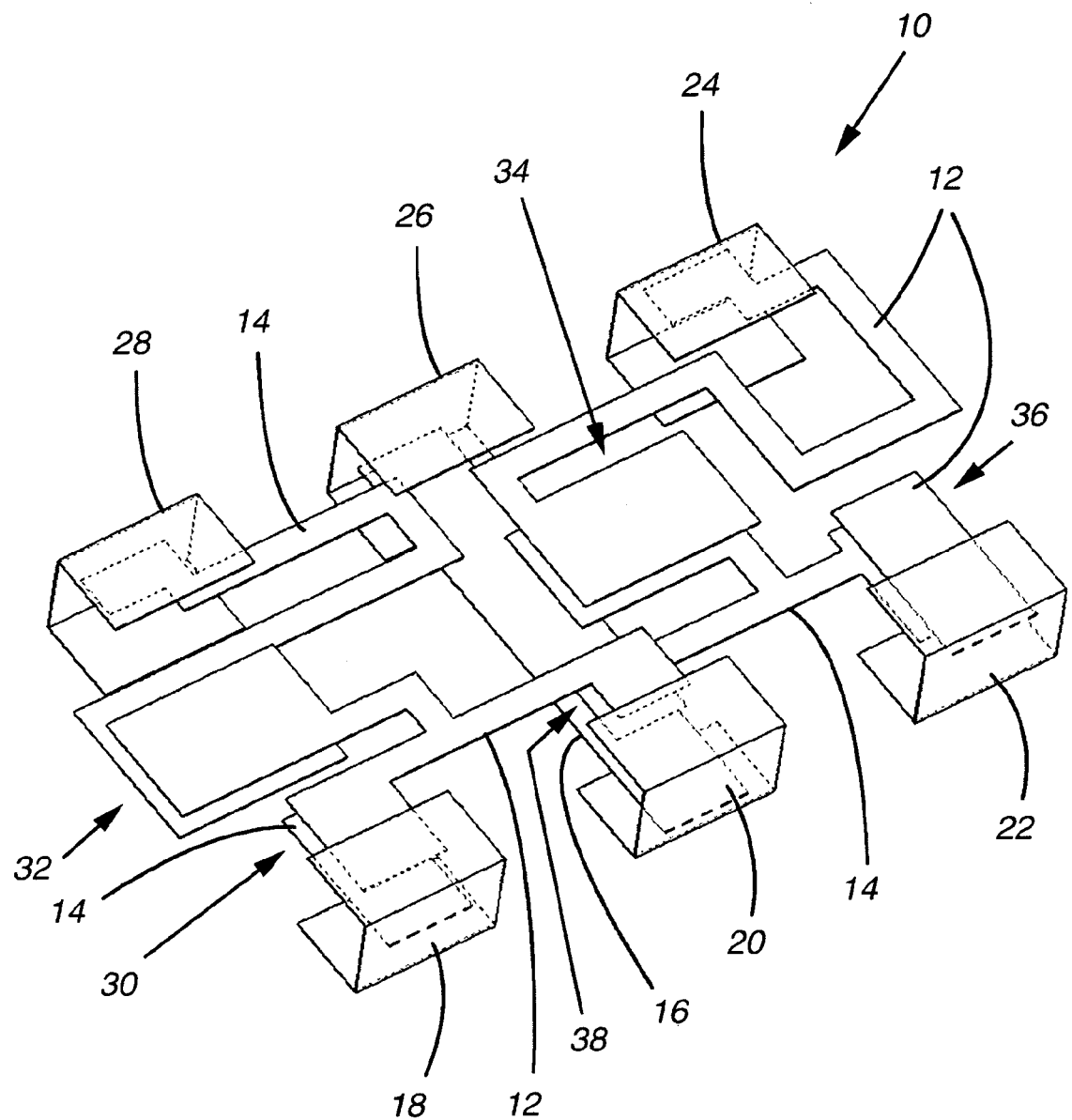
FIG. 1 is a not-to-scale isometric view of the conductor layers and terminals in a filter circuit incorporating prior art capacitors.

FIG. 1 shows the conductive portions of a prior art filter circuit 10 typically constructed of layers of LTCC materials and deposited conductive materials, including a first conductive pathway 12, a second conductive pathway 14, a ground conductor 16, a first terminal 18 serving as an input terminal, a second terminal 20, a third terminal 22 serving as an output terminal, a fourth terminal 24, a fifth terminal 26 and a sixth terminal 28. All terminals except the input and output terminals are connected to ground. Within this prior art filter circuit 10 are circuit elements including a first capacitor 30, a second capacitor 32, a third capacitor 34, a fourth capacitor 36 and a fifth capacitor 38. All of these capacitors are of the conventional parallel plate construction, with generally rectangular plates having a low aspect ratio. In general, this form of capacitor can be called a square capacitor. Capacitors of this construction will suffer from parasitic inductance and thus insertion loss at high frequencies. Each individual conductor has an individual parasitic inductance resulting from the magnetic field around the conductor generated by the current flowing through the conductor. In a capacitor, the current flows through the first and second conductors during charging and discharging, and the overall parasitic inductance results from the magnetic field generated thereby. As the electrons flowing in from one end during charging have the same direction as the electrons flowing out to the other end, magnetic fields with the same direction are formed in both the conductors. These fields add up to form the main component of the parasitic inductance of the capacitor.

Figure 2:
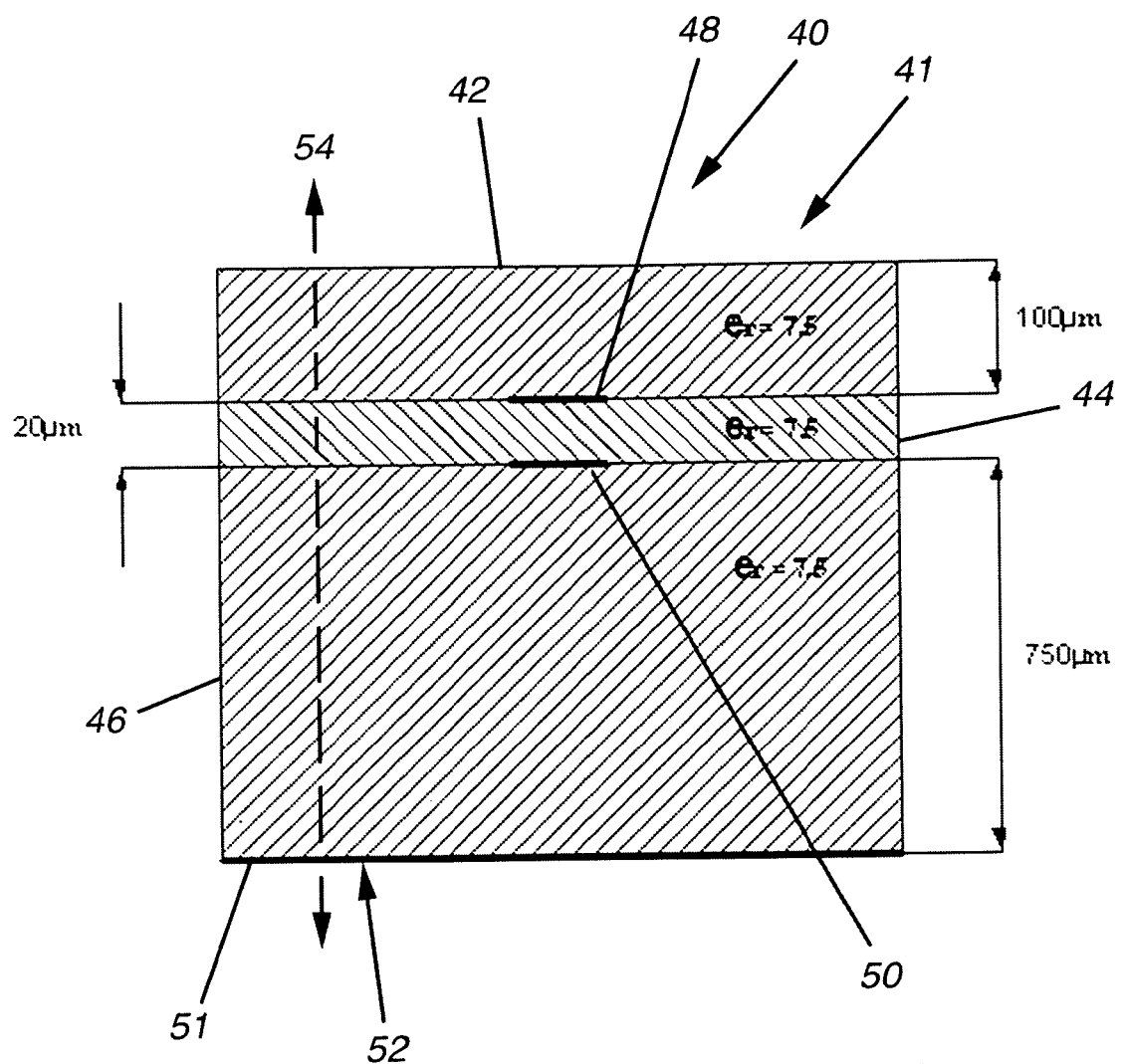
FIG. 2 is a side view of the layer structure of a typical LTCC capacitor.

FIG. 2 shows a typical ordering of dielectric and conductor layers for an LTCC realization of a capacitor 40. The layer ordering as shown in this figure does not include input, output or ground terminals. The dielectric layers are pressed and fired together along an axis of lamination 54 and constitute a dielectric body 41, comprising a first dielectric layer 42, second dielectric layer 44 and third dielectric layer 46. Each dielectric layer may be composed of multiple layers of LTCC tape, stacked together in a green state. There is a first internal conductor 48 disposed between the first dielectric layer 42 and the second dielectric layer 44, and a second internal conductor 50 disposed between the second dielectric layer 44 and the third dielectric layer 46. An optional ground conductor 52 is formed on at least a portion of the bottom surface 51 of the third dielectric layer 46. The first dielectric layer 42 functions as an environmental seal and insulator for the capacitor 40. The second dielectric layer 44 is made thin to increase the capacitance, and the third dielectric layer 46 is made thick to reduce parasitic coupling between the internal conductors and the ground conductor 52.

PREFERRED EMBODIMENTS OF THE INVENTION

Figure 3:
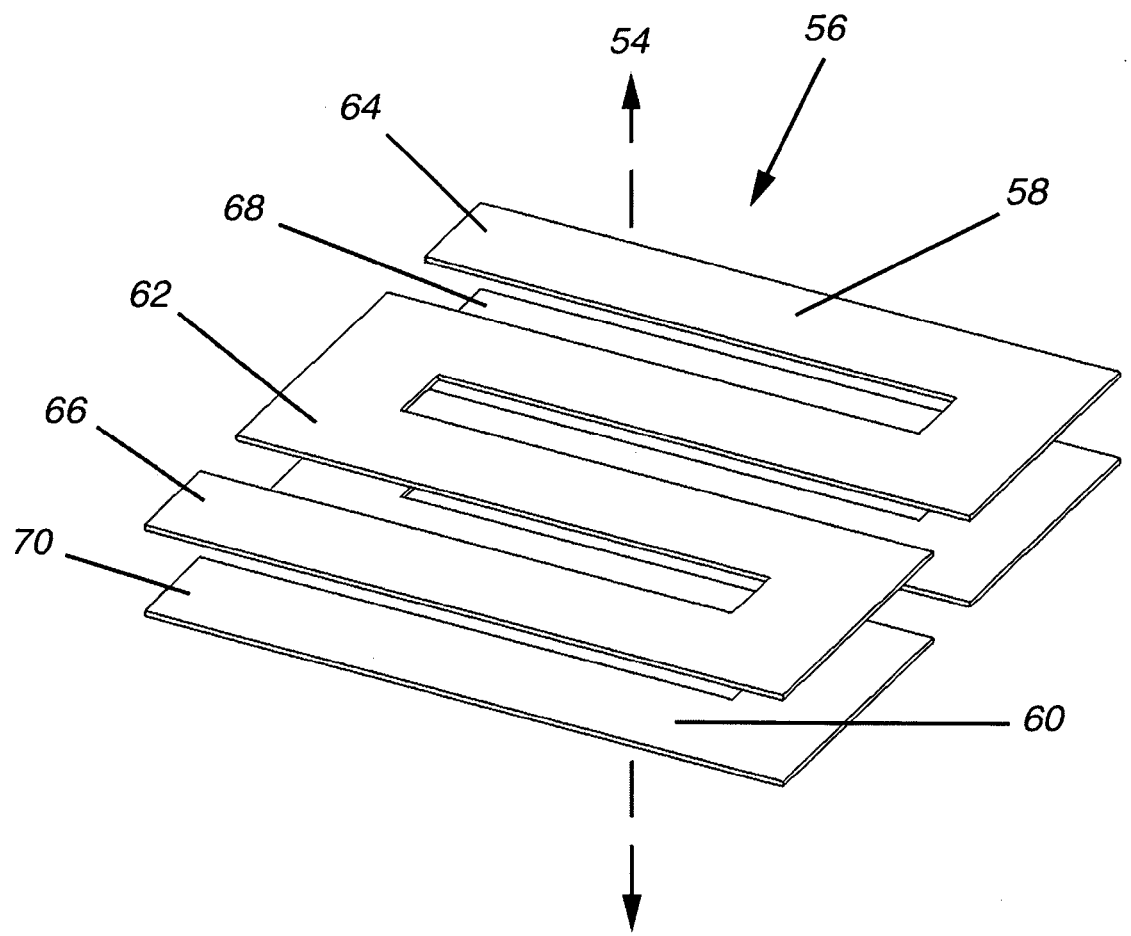
FIG. 3 is an isometric view of typical conductive paths for a low capacitive value version of the capacitor.

FIG. 3 shows the conductive plates of a capacitor structured as conductive pathways for a low value capacitor 56. The capacitor as shown in FIG. 3 has a value of approximately 1.1 pF. There is a first conductive pathway 58 and a second conductive pathway 60 of approximately identical shape, and overlapping aligned with each other along the axis of lamination 54. The conductive pathways have length substantially greater than width, approximately at least a 5:1 ratio of length to width is required for sufficiently uniformly directional current flow. Conductive pathways with relatively low length to width ratios may be made straight, but to make efficient use of area, the conductive pathways are generally given a bend region 62 or a serpentine shape by multiple bend regions that are used to fold the conductive pathways into a compact and generally rectangular form. The first conductive pathway 58 has a first end 64 and a second end 66. The second conductive pathway 60 has a third end 68 and a fourth end 70.

In the low value capacitor 56, signal is applied between the first end 64 and the fourth end 70, thereby causing equal currents to flow in opposite directions through the conductive pathways.

Figure 5:
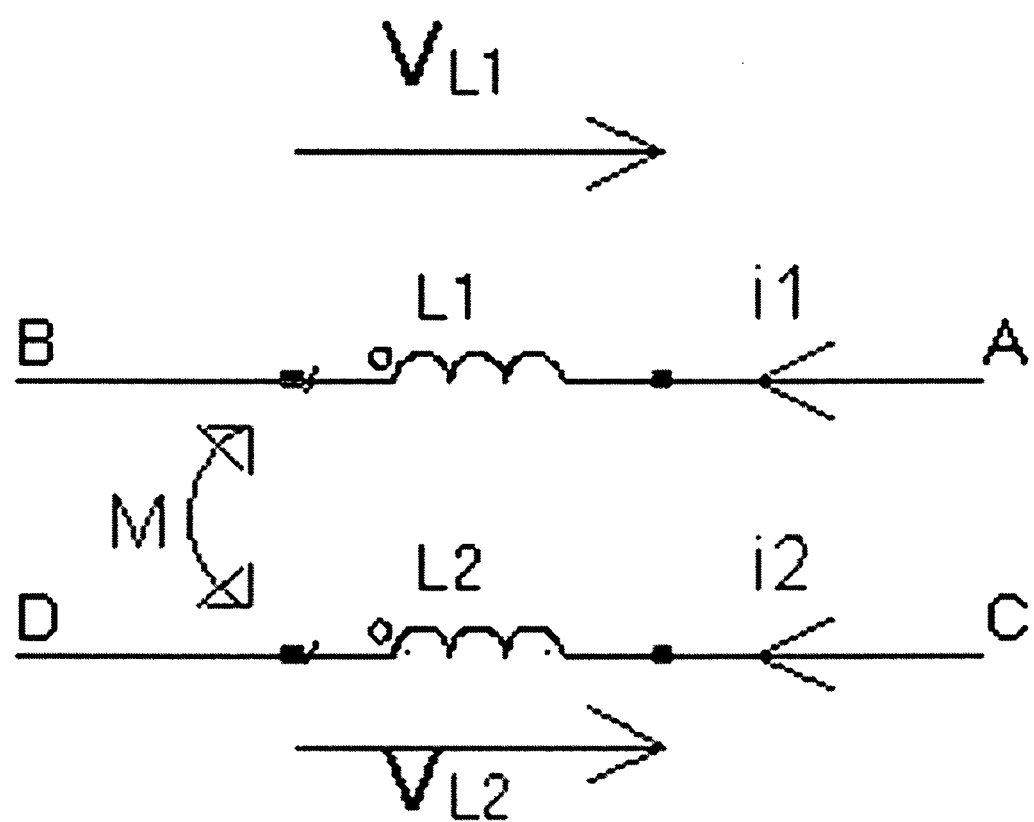
FIG. 5 is a circuit diagram of the coupled inductances in the capacitor.

FIG. 5 shows the conductive pathways of the capacitor shown in FIG. 3 modeled as inductors at high frequencies. The proximity of the conductive pathways within each capacitor causes this first parasitic inductance and second parasitic inductance to be coupled together.

The equations for the coupled inductors shown in FIG. 5 are:

$$V_{L1} = i1*S*L1 + i2*S*M$$

$$V_{L2} = i1*S*M + i2*S*L2$$

Where $$M = \sqrt{L1*L2}$$

For $$L1 = L2 = L$$

$$i1 = -i2 = i$$

Thus yielding $$M = L$$

$$V_{L1} = V_{L2} = i*S*(L-M) = 0$$

This is corresponds to an inductor with L=0H. In the physical world, $$M = k*\sqrt{L1*L2} \text{ where } 0 \leq k<1$$

Thus, the combination of the physical form of this lumped capacitor and the electrical connection made to the opposite ends of the conductive pathways yields a capacitor that substantially cancels parasitic inductance at high frequencies. When the capacitor of the present invention is charged, electrons flow simultaneously from opposite ends through their associated conductors. As the current then flows from opposite sides, essentially equal but opposing magnetic fields are produced that largely cancel each other out, thus cancelling the parasitic inductance in the capacitor. An aspect ratio approaching at least 5:1 adequately controls the current flow in each conductive layer. With a voltage signal applied between the opposite end points of the conductive layers, the equal and opposite current flow in the conductive layers results in a cancellation of the majority of the capacitor's overall parasitic inductance.

Figure 6:
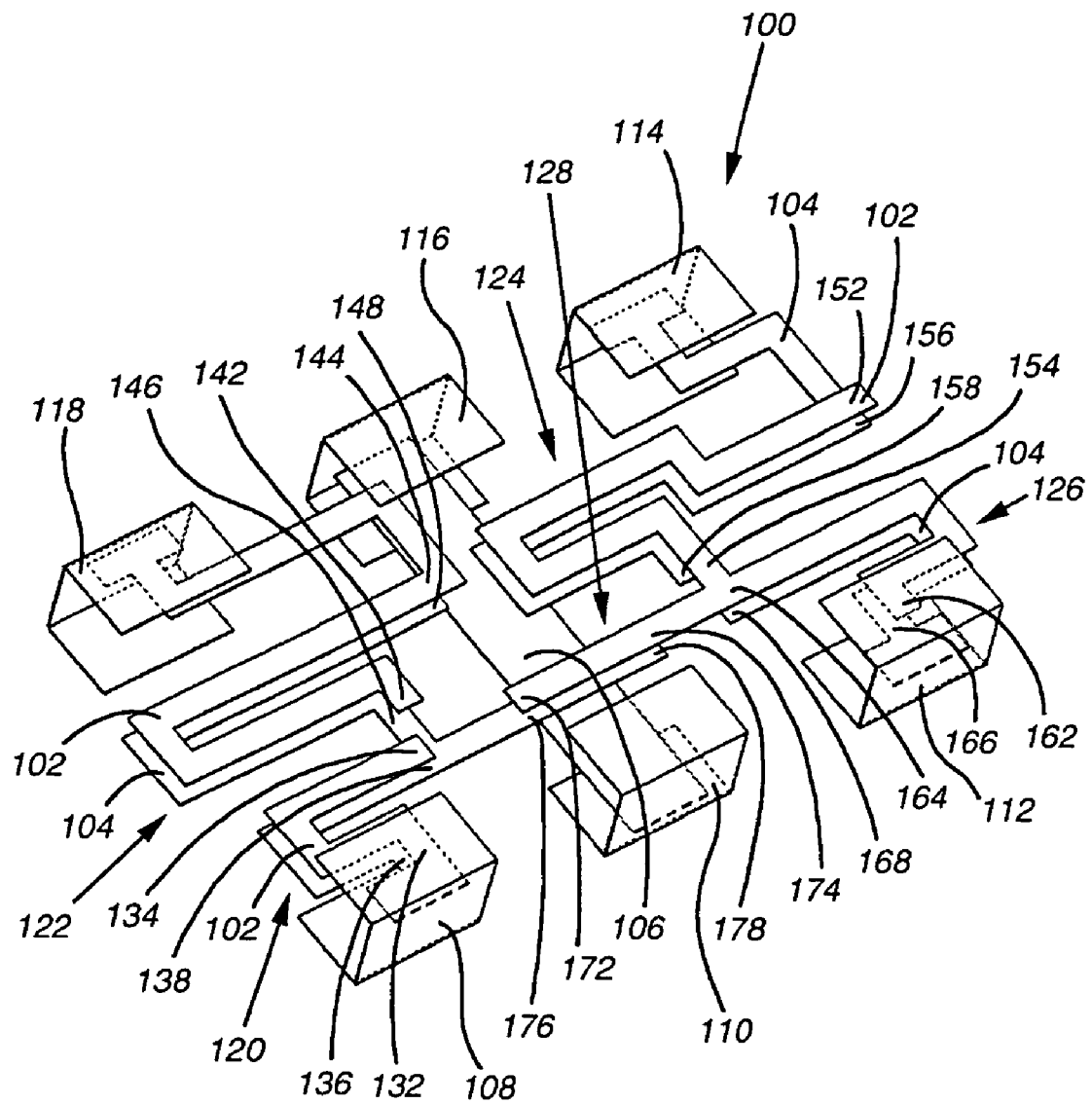
FIG. 6 is a not-to-scale isometric view of the conductor layers and terminals in a filter circuit incorporating the low loss and high frequency lumped capacitor.

FIG. 6 shows the conductive portions of a low loss filter circuit 100 typically constructed of layers of LTCC materials and deposited conductive materials, including a first conductive plane 102, a second conductive plane 104, a ground conductor 106, a first terminal 108 serving as an input terminal, a second terminal 110, a third terminal 112 serving as an output terminal, a fourth terminal 114, a fifth terminal 116 and a sixth terminal 118. With the exception of input, output and ground terminals, the layer ordering of FIG. 2 generally applies to this circuit as it did to the prior art circuit. All terminals except the input and output terminals are connected to ground. Within this filter circuit 100 are circuit elements including a first capacitor 120, a second capacitor 122, a third capacitor 124, a fourth capacitor 126 and a fifth capacitor 128. All of these capacitors are of the low loss and high frequency lumped capacitor type, and it can be seen that each capacitor comprises a pair of overlapping aligned conductive pathways composed of portions of the first and second conductive planes. The first capacitor 120 has a first end 132, a second end 134, a third end 136 and a fourth end 138. The second capacitor 122 has a first end 142, a second end 144, a third end 146 and a fourth end 148. The third capacitor 124 has a first end 152, a second end 154, a third end 156 and a fourth end 158. The fourth capacitor 126 has a first end 162, a second end 164, a third end 166 and a fourth end 168. The fifth capacitor 128 has a first end 172, a second end 174, a third end 176 and a fourth end 178. While in some places one of the conductive planes will continue past the ends of the capacitor structure with no physical interruption to the metalization, the opposite and discretely bounded end of the capacitor defines the location of both ends for that side of the capacitor, as would be the case with any capacitive structure, since any boundary to a conductive plate in a capacitor will define a boundary of the region where the electric field will be present in the dielectric layer between the capacitor's conductive plates. In some places it can be seen that portions of the conductive planes form conductive paths between some of the capacitors, without being parts of the capacitors themselves. While at least one of the two conductors forming a capacitor may extend past the boundaries of the other conductor, the overlapping conductor boundary regions are what forms the capacitor, and further in the case of the present invention the overlapping of the end regions yields particularly close matching of current flow to optimize cancellation of parasitic inductance. An increment of parasitic inductance is present in the conductive regions beyond fourth end 138 and first end 132, but industry standard best practices in high frequency circuit layout will minimize the length of such areas, and as areas not being part of the capacitive structures, their increment of parasitic inductance is not measured as part of the capacitor. All of these capacitors contain serpentine pathways except the fifth capacitor 128, which contains a straight pathway with an approximately 6:1 length to width ratio.

Figure 7:
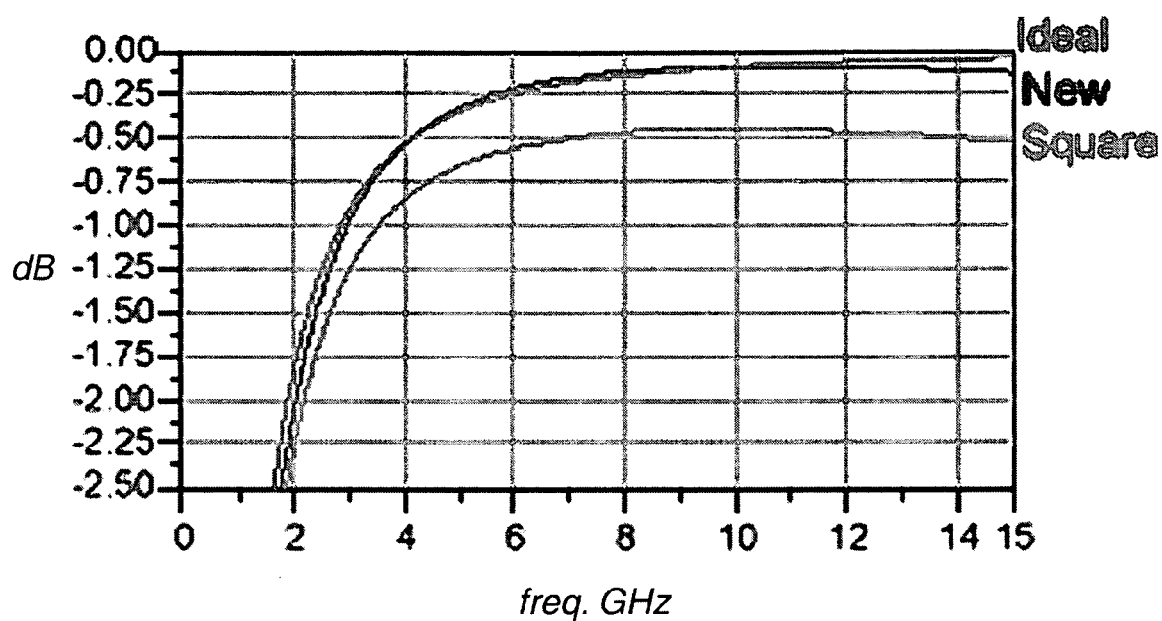
FIG. 7 is a frequency plot showing the superimposed responses of low-value ideal, low-loss and rectilinear conductor capacitors.

FIG. 7 shows a graph of simulation data for the insertion loss of three different 1.1 pF capacitors, being an ideal capacitor, a low loss and high frequency lumped capacitor, and a prior art square capacitor. It can be seen that the insertion loss performance of the low loss and high frequency lumped capacitor is close to ideal, while there is considerable insertion loss experienced by the square capacitor.

Figure 9:
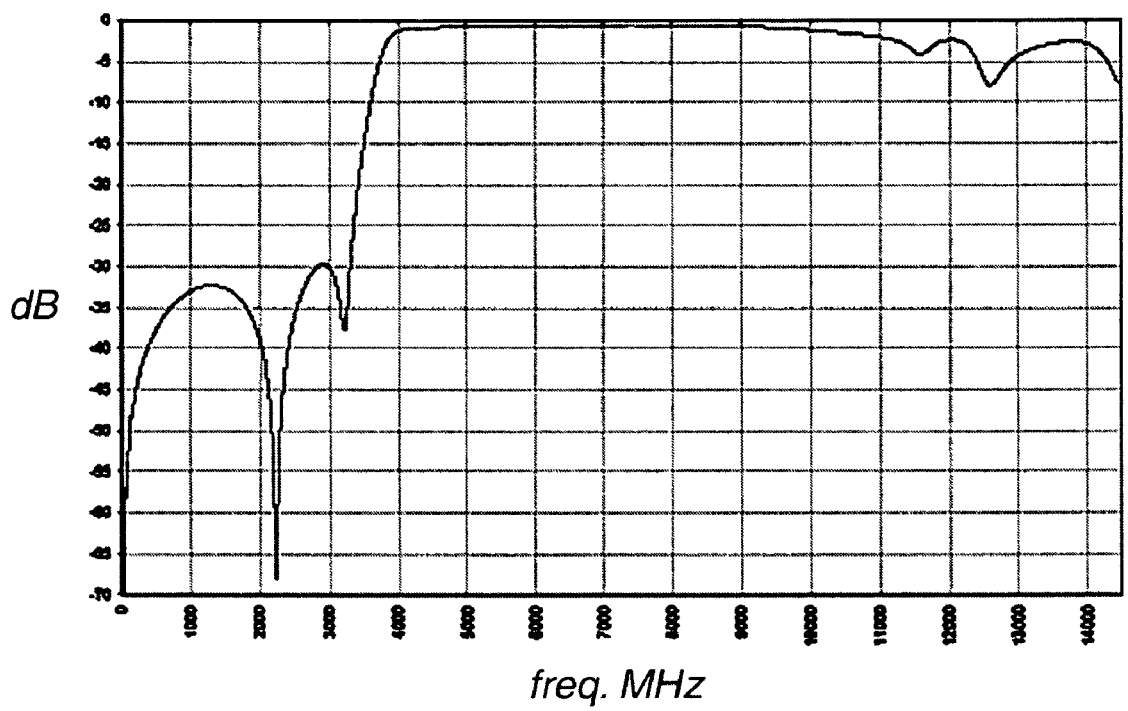
FIG. 9 is transmission vs. frequency plot of a highpass filter constructed with the low loss and high frequency lumped capacitor.
Figure 10:
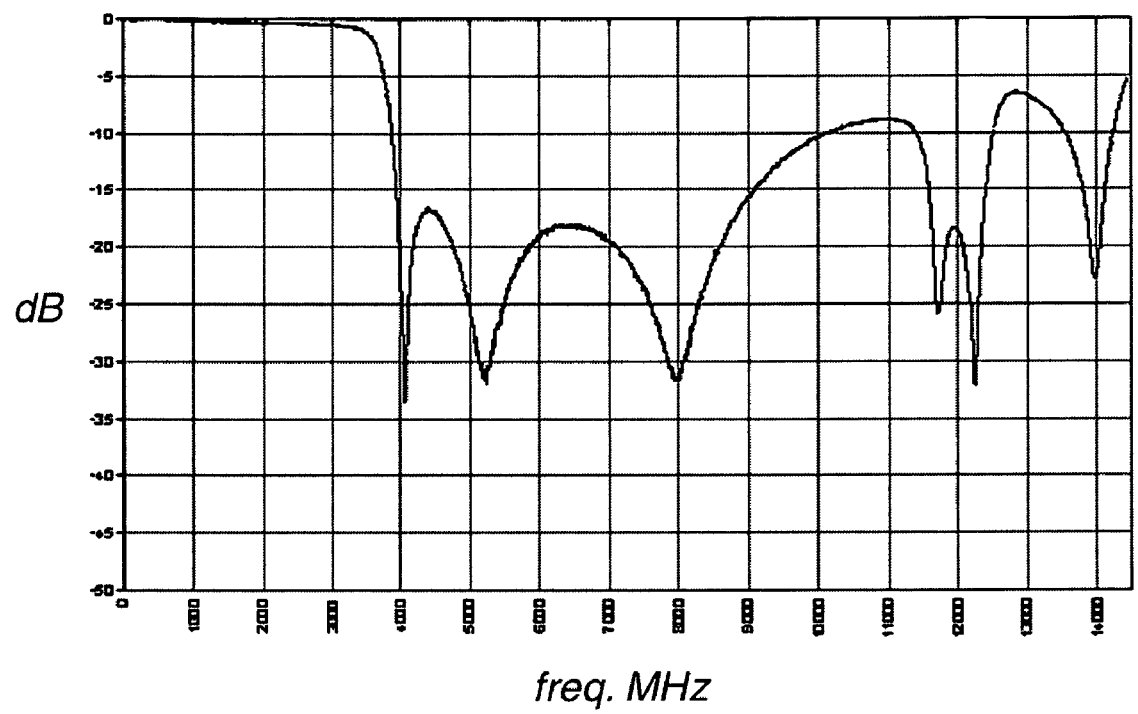
FIG. 10 is a reflection vs. frequency plot of a highpass filter constructed with the low loss and high frequency lumped capacitor.

FIG. 9 shows the high-pass response versus frequency for the filter of FIG. 6, and it can be seen that the high frequency performance is close to the ideal 0 dB level. FIG. 10 shows the reflection characteristics versus frequency for the filter of FIG. 6.

Figure 4:
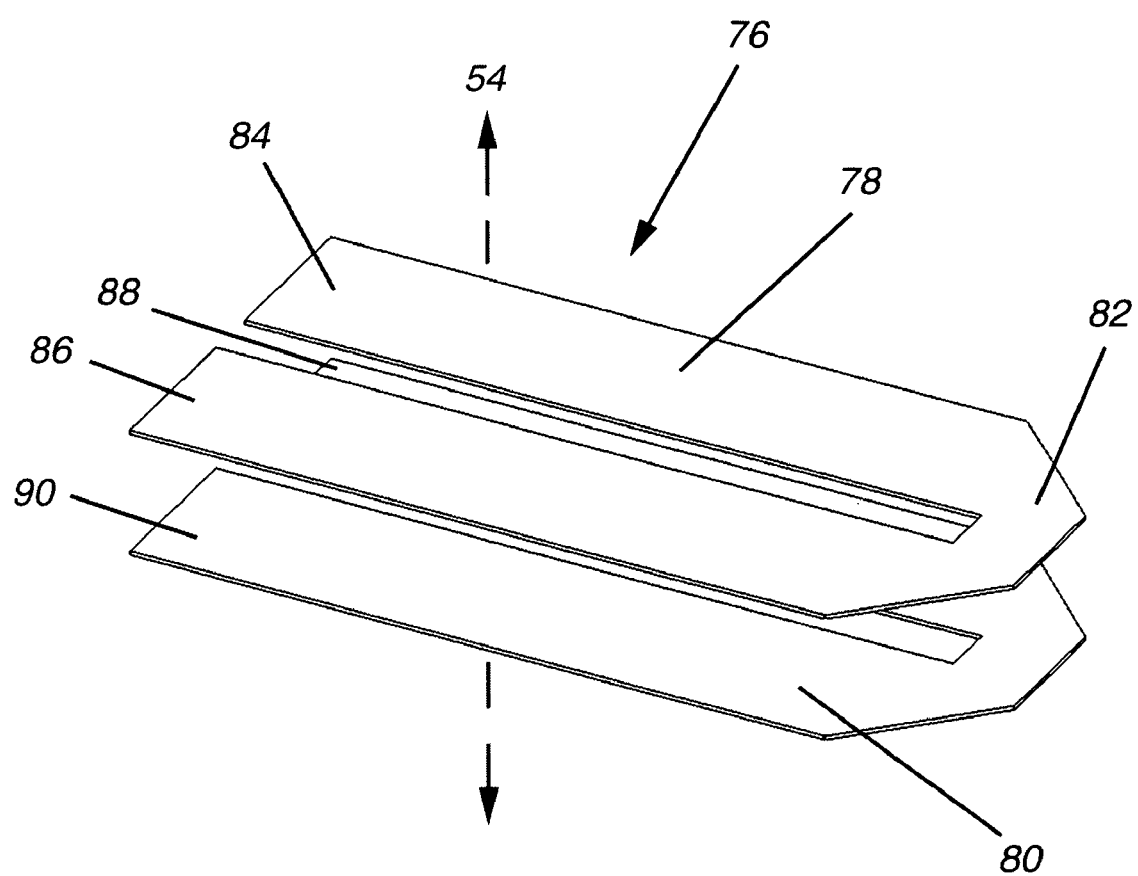
FIG. 4 is an isometric view of typical conductive paths for a high capacitive value version of the capacitor.

Another embodiment of the invention is shown in FIG. 4 with the conductive plates of a capacitor structured as conductive pathways for a high value capacitor 76. The capacitor as shown here has a value of approximately 4.5 pF. There is a first conductive pathway 78 and a second conductive pathway 80 of substantially identical shape, and overlapping aligned with each other along the axis of lamination 54. The conductive pathways have length substantially greater than width, and to make efficient use of area are given a serpentine shape by bend region 82 that is used to fold the conductive pathways into a compact and generally rectangular form. The first conductive pathway 78 has a first end 84 and a second end 86. The second conductive pathway 54 has a third end 88 and a fourth end 90.

In the high value capacitor 76, signal is applied between the first end 84 and the fourth end 90, thereby causing equal currents to flow in opposite directions through the conductive pathways.

Figure 8:
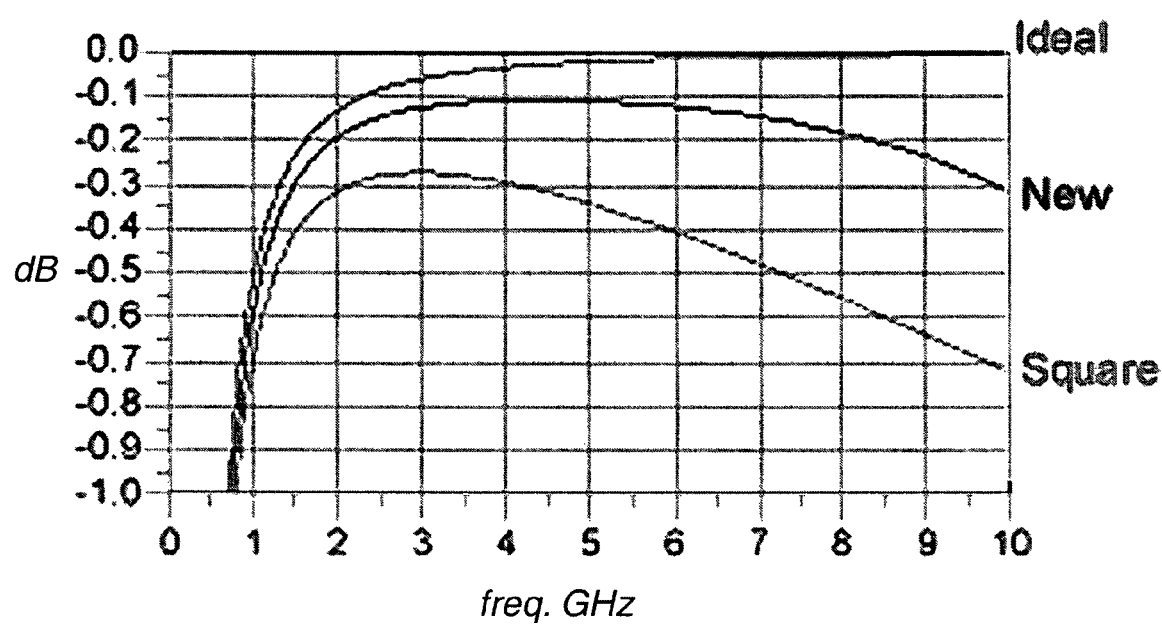
FIG. 8 is a frequency plot showing the superimposed responses of higher-value ideal, low-loss and rectilinear conductor capacitors.

FIG. 8 shows a graph of simulation data for the insertion loss of three different 4.5 pF capacitors, being an ideal capacitor, a low loss and high frequency lumped capacitor, and a prior art square capacitor. It can be seen that the insertion loss performance of the low loss and high frequency lumped capacitor is closer to that of the ideal capacitor, and substantially better than the insertion loss experienced by the square capacitor. The high frequency performance of the 4.5 pF capacitor is less ideal than that of the 1.1 pF capacitor due to the increased physical size of the higher capacitance device.

Another embodiment of the invention would incorporate metallic conductive layers deposited and shaped by techniques other than silkscreening, for example by methods including but not limited to vacuum metalization, adhering metal foil, and spraying. Shaping of the conductive pathways may also be accomplished by methods including but not limited to etching, masking and mechanical removal.

Yet another embodiment of the invention would use sufficiently conductive nonmetallic conductive materials at least partially in place of metallic conductive materials.

Having described herein illustrative embodiments and best mode of the present invention, persons of ordinary skill in the art will appreciate various other features and advantages of the invention apart from those specifically described above. It should therefore be understood that the foregoing is only illustrative of the principles of the invention, and that various modifications and additions can be made by those skilled in the art without departing from the spirit and scope of the invention. Accordingly, the appended claims shall not be limited by the particular features that have been shown and described, but shall be construed also to cover any obvious modifications and equivalents thereof.

What is claimed is:

1. A capacitor comprising:
   a laminated dielectric structure having three layers stacked on one another;
   a first internal conductor being bounded by a first end and a second end and disposed between the first layer and the second layer of said laminated dielectric structure, said first internal conductor having a first current flowing therethrough in a given direction, said first current inducing a first parasitic inductance therewith;
   a second internal conductor being bounded by a third end and a fourth end and disposed between said second layer and the third layer of said laminated dielectric structure and aligned with said first internal conductor and having a substantially similar shape to said first internal conductor, said second internal conductor having a second current equal to said first current and flowing therethrough in a direction opposite said given direction, said second current inducing a second parasitic inductance therewith;
   said second parasitic inductance being equal and opposite to said first parasitic inductance;
   said capacitor having an overall parasitic inductance; and,
   said first parasitic inductance and said second parasitic inductance coupling to substantially cancel said overall parasitic inductance of said capacitor.

2. The capacitor of claim 1 wherein said first internal conductor and said second internal conductor have identical length to width ratios of at least 5:1.

3. The capacitor of claim 2 wherein said first internal conductor and said second internal conductor each have at least one bend region.

4. The capacitor of claim 3 wherein said first internal conductor and said second internal conductor are at least partially formed into serpentine pathways.

5. The capacitor of claim 1 wherein said dielectric layers are composed of an LTCC material.

6. The capacitor of claim 5 wherein said first dielectric layer has a thickness of approximately 100 microns, said second dielectric layer has a thickness of approximately 20 microns, and said third dielectric layer has a thickness of approximately 750 microns.

7. The capacitor of claim 1 wherein said third dielectric layer has a bottom surface forming a planar portion of the exterior of said dielectric body, said capacitor further comprising a ground conductor covering at least a portion of said bottom surface.

8. The capacitor of claim 1 wherein the capacitance of said capacitor is measured between said first end and said fourth end.

9. A capacitor comprising:
   a first internal conductor and a second internal conductor respectively disposed between a plurality of dielectric layers composed of LTCC material;
   said plurality of dielectric layers laminated together along an axis of lamination to form a dielectric body and comprising first, second and third dielectric layers each of substantially similar rectangular form;
   said first dielectric layer having a thickness of approximately 100 microns, said second dielectric layer having a thickness of approximately 20 microns, and said third dielectric layer having a thickness of approximately 750 microns;
   said first internal conductor disposed between said first and second dielectric layers and said second internal conductor disposed between said second and third dielectric layers;

said first internal conductor being bounded by a first end and a second end and having a length to width ratio of at least 5:1;

said second internal conductor bounded by a third end and a fourth end and having a shape substantially similar to the shape of said first internal conductor and being aligned to overlap said first internal conductor along said axis of lamination;

said first internal conductor having a first current flowing therethrough in a given direction, said first current inducing a first parasitic inductance therewith;

second internal conductor having a second current equal to said first current and flowing therethrough in a direction opposite said given direction, said second current inducing a second parasitic inductance therewith;

said second parasitic inductance being equal and opposite to said first parasitic inductance;

said capacitor having an overall parasitic inductance; and, said first parasitic inductance and said second parasitic inductance coupling to substantially cancel said overall parasitic inductance of said capacitor.

10. The capacitor of claim 9 wherein the capacitance of said capacitor is measured between said first end and said fourth end.

11. The capacitor of claim 9 wherein said third dielectric layer has a bottom surface forming a planar portion of the exterior of said dielectric body, said capacitor further comprising a ground conductor covering at least a portion of said bottom surface.

12. The capacitor of claim 9 wherein said first internal conductor and said second internal conductor each have at least one bend region.

13. The capacitor of claim 12 wherein said first internal conductor and said second internal conductor are at least partially formed into serpentine pathways.

14. A low loss filter circuit including at least one low loss and high frequency lumped capacitor, said capacitor comprising:

a laminated dielectric structure having at least three layers stacked on one another;

a first internal conductor being bounded by a first end and a second end and disposed between the first layer and the second layer of said laminated dielectric structure, said first internal conductor having a first current flowing therethrough in a given direction, said first current inducing a first parasitic inductance therewith;

a second internal conductor being bounded by a third end and a fourth end and disposed between said second layer and the third layer of said laminated dielectric structure and aligned with said first internal conductor and having a substantially similar shape to said first internal conductor, said second internal conductor having a second current equal to said first current and flowing therethrough in a direction opposite said given direction, said second current inducing a second parasitic inductance therewith;

said second parasitic inductance being equal and opposite to said first parasitic inductance;

said capacitor having an overall parasitic inductance; and, said first parasitic inductance and said second parasitic inductance coupling to substantially cancel said overall parasitic inductance of said capacitor.

15. The low loss filter circuit of claim 14 wherein said first internal conductor and said second internal conductor have identical length to width ratios of at least 5:1.

16. The low loss filter circuit of claim 15 wherein said first internal conductor and said second internal conductor each have at least one bend region.

17. The low loss filter circuit of claim 16 wherein said first internal conductor and said second internal conductor are at least partially formed into serpentine pathways.

18. The low loss filter circuit of claim 14 wherein said dielectric layers are composed of an LTCC material.

19. The low loss filter circuit of claim 18 wherein said first dielectric layer has a thickness of approximately 100 microns, said second dielectric layer has a thickness of approximately 20 microns, and said third dielectric layer has a thickness of approximately 750 microns.

20. A low loss filter circuit including at least one low loss and high frequency lumped capacitor, said capacitor comprising:

a first internal conductor and a second internal conductor respectively disposed between a plurality of dielectric layers composed of LTCC material;

said plurality of dielectric layers laminated together along an axis of lamination to form a dielectric body and comprising at least first, second and third dielectric layers each of substantially similar rectangular form;

said first dielectric layer having a thickness of approximately 100 microns, said second dielectric layer having a thickness of approximately 20 microns, and said third dielectric layer having a thickness of approximately 750 microns;

said first internal conductor disposed between said first and second dielectric layers and said second internal conductor disposed between said second and third dielectric layers;

said first internal conductor being bounded by a first end and a second end and having a length to width ratio of at least 5:1;

said second internal conductor bounded by a third end and a fourth end and having a shape substantially similar to the shape of said first internal conductor and being aligned to overlap said first internal conductor along said axis of lamination;

said first internal conductor having a first current flowing therethrough in a given direction, said first current inducing a first parasitic inductance therewith;

second internal conductor having a second current equal to said first current and flowing therethrough in a direction opposite said given direction, said second current inducing a second parasitic inductance therewith;

said second parasitic inductance being equal and opposite to said first parasitic inductance;

said capacitor having an overall parasitic inductance; and, said first parasitic inductance and said second parasitic inductance coupling to substantially cancel said overall parasitic inductance of said capacitor.

21. The low loss filter circuit of claim 20 wherein said first internal conductor and said second internal conductor each have at least one bend region.

22. The low loss filter circuit of claim 21 wherein said first internal conductor and said second internal conductor are at least partially formed into serpentine pathways.

* * * * *